United States Patent [19]

Sugiyama et al.

[11] Patent Number: 5,214,493
[45] Date of Patent: May 25, 1993

[54] REDUCTION EXPOSURE APPARATUS WITH CORRECTION FOR ALIGNMENT LIGHT HAVING INHOMOGENEOUS INTENSITY DISTRIBUTION

[75] Inventors: Shuji Sugiyama, Mito; Yoshimitsu Saze; Katsunori Onuki, both of Katsuta, all of Japan

[73] Assignee: Hitachi, Ltd., Tokyo, Japan

[21] Appl. No.: 746,612

[22] Filed: Aug. 19, 1991

[30] Foreign Application Priority Data

Aug. 29, 1990 [JP] Japan .................. 2-225324

[51] Int. Cl.⁵ .................................. G01B 11/26
[52] U.S. Cl. ........................... 356/401; 250/548
[58] Field of Search ............... 346/401, 400; 250/548; 355/53, 54

[56] References Cited

U.S. PATENT DOCUMENTS 4,943,733 7/1990 Mori et al. .................. 250/548

Primary Examiner—Samuel A. Turner
Attorney, Agent, or Firm—Antonelli, Terry, Stout & Kraus

[57] ABSTRACT

A diffraction grating shaped reference pattern having the same grating pitch as diffraction grating shaped alignment pattern formed on a wafer is irradiated by alignment light, and the diffracted light signal obtained from the reference pattern is stored in a memory. The diffraction grating shaped alignment pattern formed on the wafer is irradiated by the alignment light, and the diffracted light signal from the alignment pattern is corrected based on the diffracted light signal stored in the memory.

14 Claims, 5 Drawing Sheets

F I G. 5
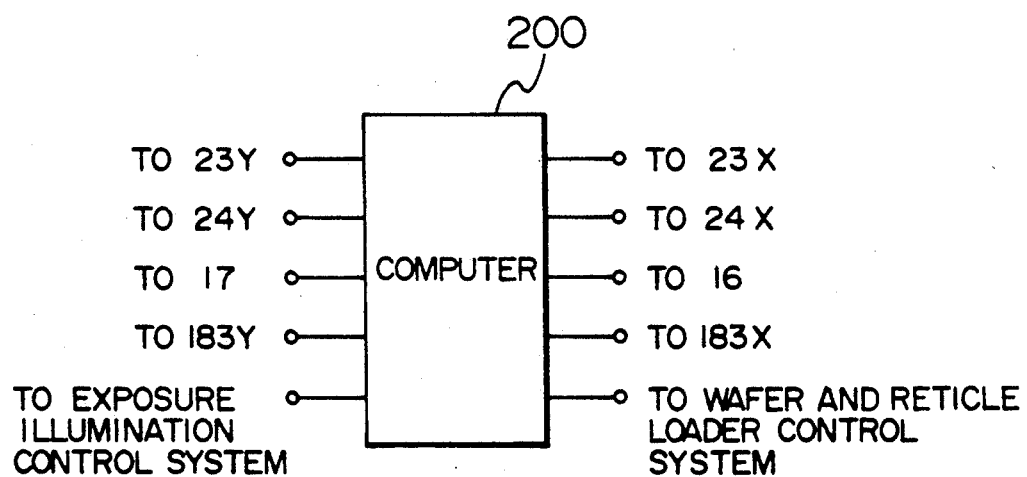

REDUCTION EXPOSURE APPARATUS WITH CORRECTION FOR ALIGNMENT LIGHT HAVING INHOMOGENEOUS INTENSITY DISTRIBUTION

BACKGROUND OF THE INVENTION

1. FIELD OF THE INVENTION

This invention relates to a light exposure apparatus, and particularly to a light exposure apparatus suitable for use in the manufacture of LSIs having fine patterns.

2. DESCRIPTION OF THE PRIOR ART

As described in U.S. Pat. No. 4,566,795 issued to Nippon Kagaku K.K., on Jan. 28, 1986, light is directed to an alignment pattern and higher-order diffracted light generated therefrom is used to detect the alignment pattern. This is because the waveform of the alignment pattern detected by using the higher-order diffracted light is so simple that the position of the alignment pattern can be detected with high precision by a simple algorithm.

However, it is the present situation that when the alignment pattern is detected, attention is not paid particularly to the correction of the detected alignment pattern signal for the background, and hence to the correction of the distortion of the signal based on the inhomogeneous intensity distribution of the light by which the alignment pattern is irradiated.

SUMMARY OF THE INVENTION

Accordingly, it is an object of the invention to provide a light exposure apparatus suited to effectively correct the background of the alignment pattern signal.

It is another object of the invention to provide a light exposure apparatus suited to effectively correct the distortion of the alignment pattern signal.

According to this invention, light is directed to a diffraction grating shaped alignment pattern and to a diffraction grating shaped reference pattern having substantially the same grating pitch as the diffraction grating shaped alignment pattern, and signals of high-order diffracted rays obtained from those patterns are detected and compared with each other.

By this comparison, it is possible to correct the background of the pattern detected signal, and thus to correct the distortion of the signal due to the inhomogeneous distribution of the light intensity.

The other objects and features of the invention will be apparent from the following description with reference to the accompanying drawings.

BRIEF DESCRIPTION OF THE DRAWINGS

FIG. 5 is a diagram showing the connection terminals of the computer block used in the embodiment shown in FIG. 1.

DESCRIPTION OF THE PREFERRED EMBODIMENT

Figure 1:
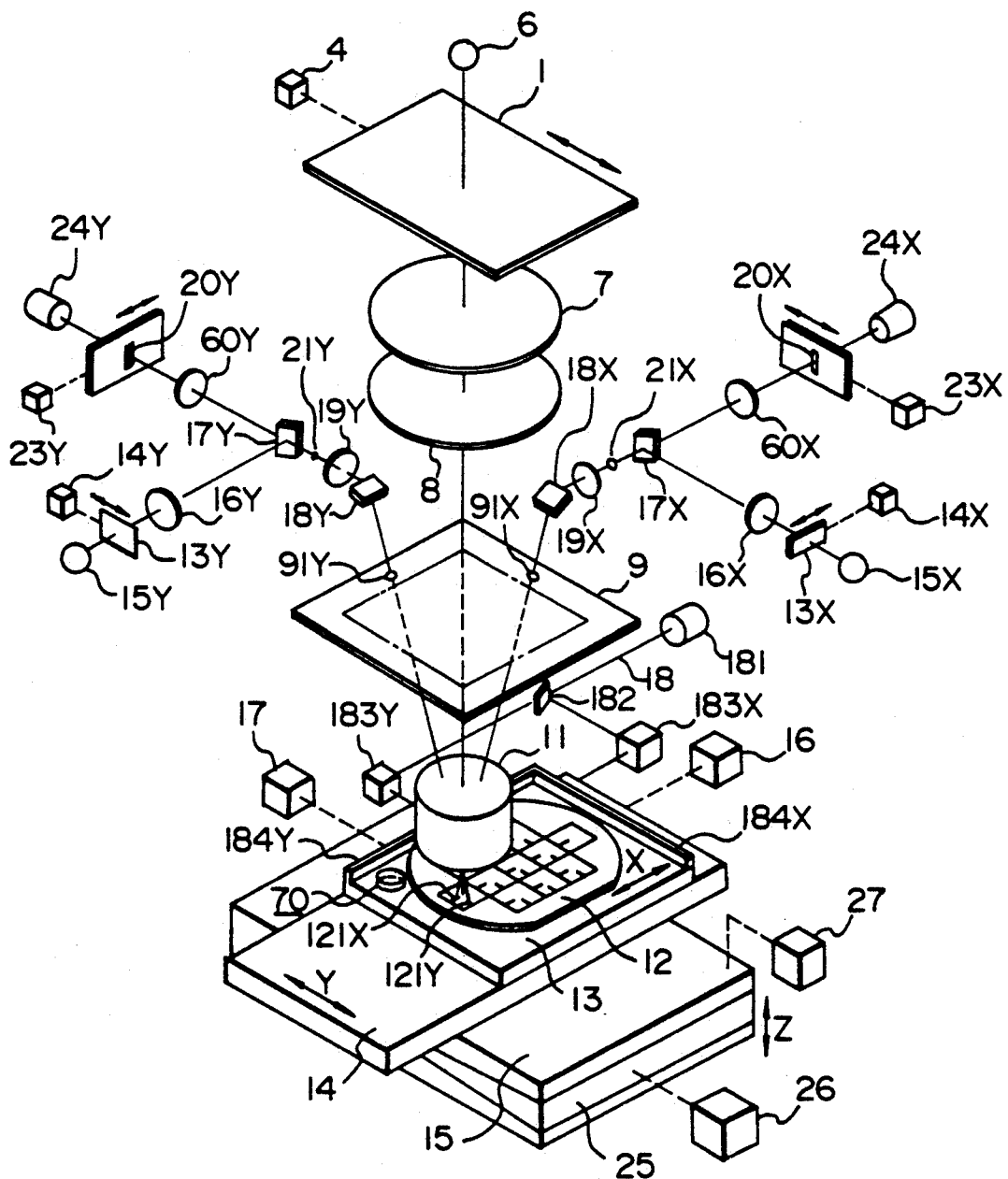
FIG. 1 is a perspective view of a main optical portion of one embodiment of the light exposure apparatus of the invention.

Referring to FIG. 1, there are shown an X-stage 13, a Y-stage 14 and a Z-stage 15. A wafer 12 being exposed to light is placed on the X-stage. The positions of the wafer 12 in the X- and Y-directions are detected by a laser length-measuring system 18 and controlled to change with a precision of about 0.05 µm by servo motors 16, 17. Reference numerals 181 to 184X, Y represent components of the laser length-measuring system 18. In other words, 181 designates a laser source, 182 a beam splitter, 183X, 183Y interferometers, and 184X, 184Y mirrors. In addition, there are shown a wedge-shaped member 25 which, when moved in the Y-direction by a drive 26, moves the Z-stage 15 up and down. Shown at 27 is a detector for detecting the height of the Z-stage 15, and 6 is a light source for exposure. The light from the light source 6 is stopped by or passed through a shutter 1 which is opened and closed by a drive 4. The light passed through the shutter 1 is directed through condenser lenses 7, 8 to a reticle 9 which is composed of a substrate and a pattern formed thereon. The image of the reticle 9 or the image of the pattern is formed on the wafer 12 by a reduction lens 11, thus exposing the photoresist coated thereon. By driving the X-stage and Y-stage of the exposure optical system in a step-and-repeat manner, it is possible to transfer the circuit pattern of the reticle 9 onto the entire surface of the wafer 12. 13X, 13Y to 24X, 24Y (of which reference numeral 22 is not shown) and 60X, 60Y represent a diffracted light pattern detection optical system. The diffracted light pattern detection optical system serves to detect the position of the preceding pattern provided for the next reticle pattern to be correctly overlapped on the preceding reticle pattern which was transferred on the wafer and etched. 91X and 91Y represent openings which are provided in the reticle 9 so as to allow the alignment light to pass therethrough. The diffracted light pattern detection optical system is provided for the two axes X and Y. As described in detail later, a diffraction grating shaped reference pattern 70 for correcting the inhomogeneous illumination is provided on the stage 13, and it can be moved below the reduction lens 11 and detected by the diffracted light pattern detection optical system. Of course, the diffraction grating shaped alignment patterns 121X and 121Y can be similarly detected by the diffracted light pattern detection optical system.

Figure 2:
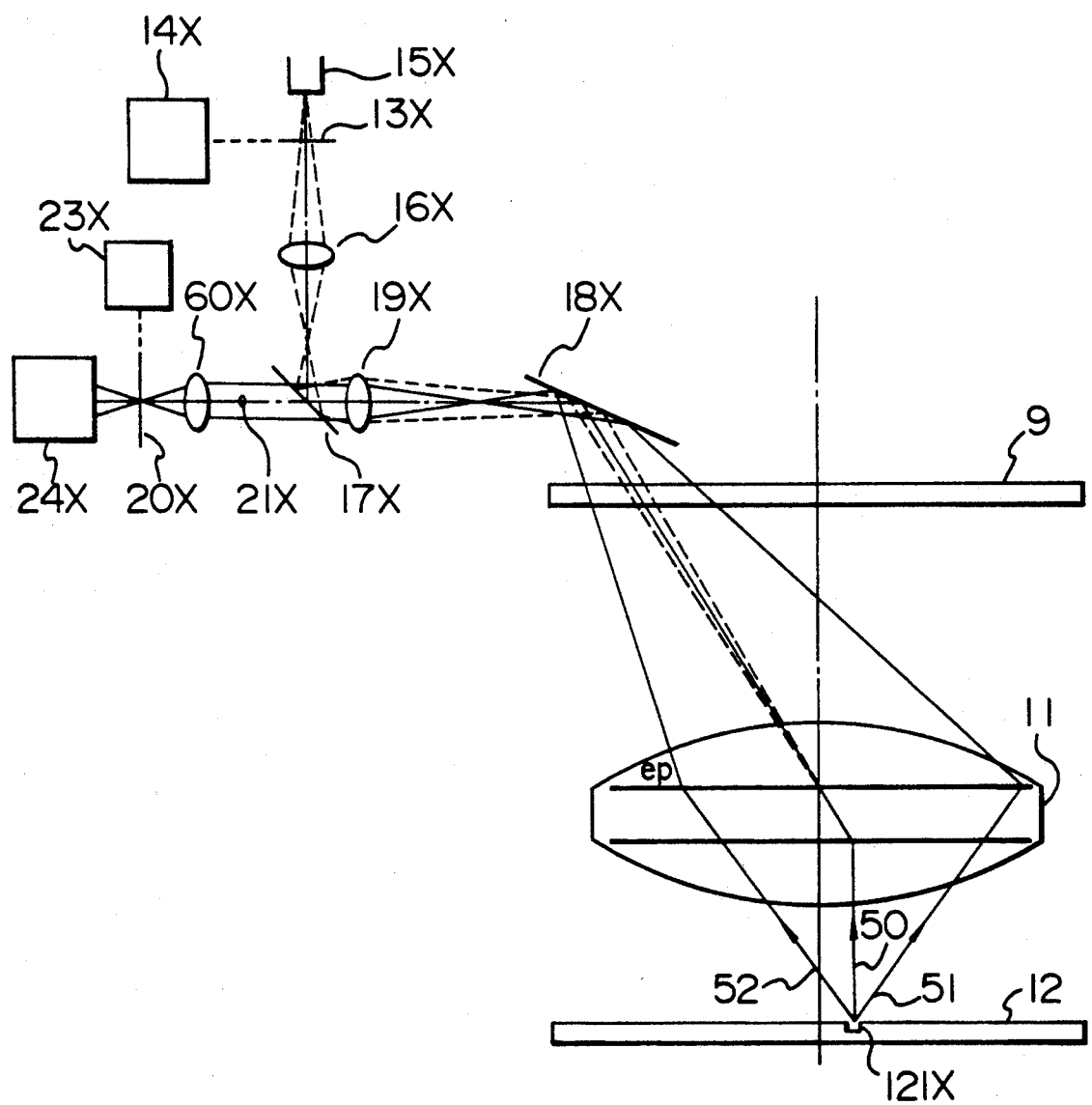
FIG. 2 is a diagram of the alignment pattern detecting optical system in the X-direction shown in FIG. 1.
Figure 3:
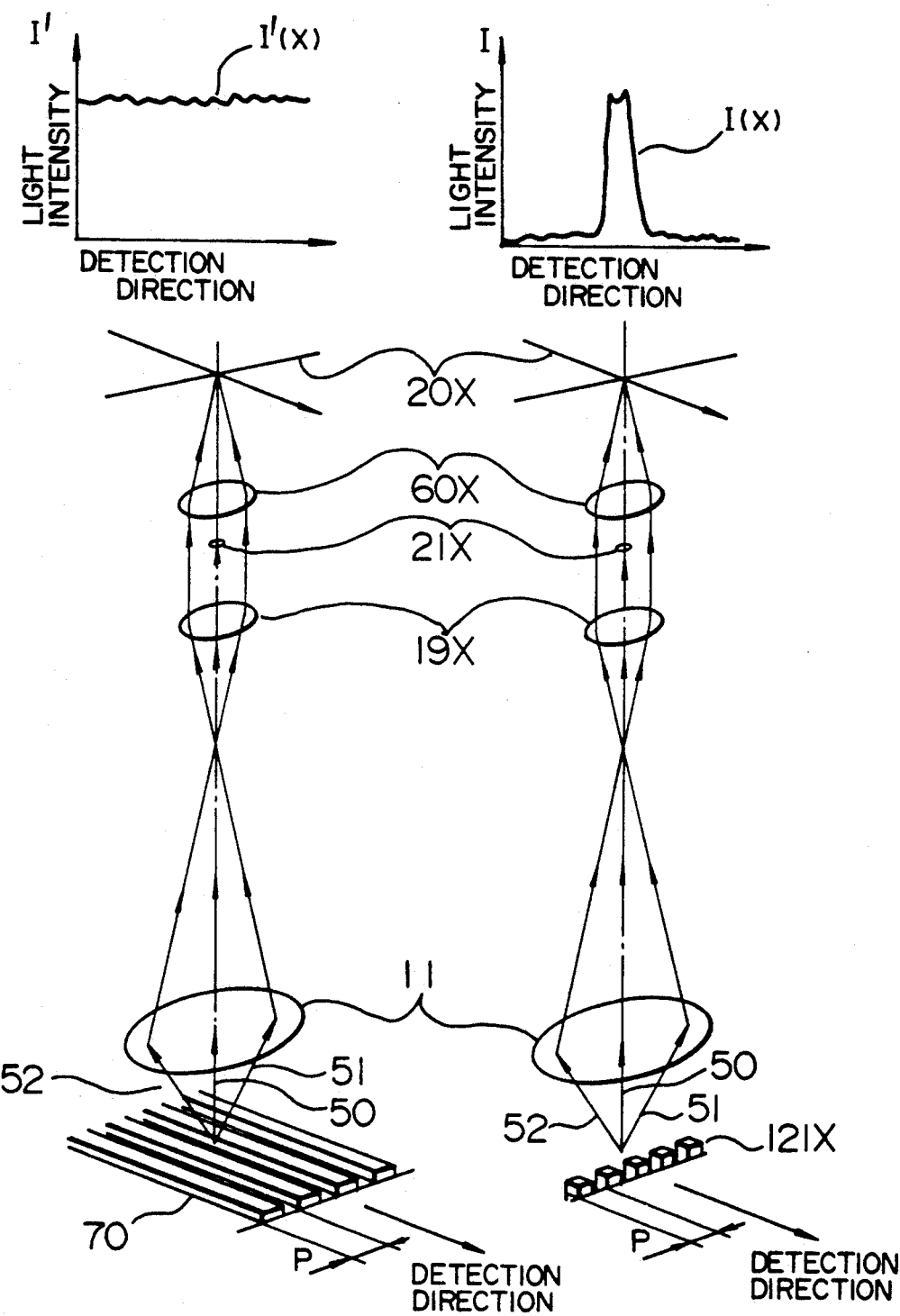
FIG. 3A is a diagram showing the alignment pattern signal detecting optical system and the detected signal waveform of the reference diffraction grating alignment pattern detected by the optical system.
FIG. 3B is a diagram showing the alignment pattern signal detecting optical system and the detected waveform of the wafer diffraction grating alignment pattern detected by this optical system.

Referring to FIG. 2, the alignment light emitted from an illumination source 15X, when the shutter 13X is opened by the shutter drive 14X, is directed toward the reduction lens 11 by mirrors 17X, 18X. The image of the light source is formed on the incident pupil (ep) of the reduction lens 11 by the lenses 16X, 19X. The alignment light exiting from the reduction lens 11 impinges on the diffraction grating shaped alignment pattern 121X formed on the wafer 12. At this time, light rays of 0-order light, ± first-order light, ± second-order light and so on are reflected from the irradiated area, but in FIG. 3 only the 0-order light 50, and ± first-order light 51, 52 are shown for convenience of explanation. These reflected rays are passed through optical elements at different positions and finally they are focused by lens 60X on a slit 20X which is driven by a slit drive 23X, and then detected by a detector 24X. However, the 0-order ray 50 does not reach the surface of the slit 20X because it is blocked by a spatial filter 21X. In other words, only higher-order diffracted rays are focused on the slit surface.

FIG. 3B shows a detected signal I(X) resulting from detecting the diffraction grating shaped alignment pattern 121X formed on the wafer. This pattern 121X is a rectangular pattern having a pitch p and generates higher-order diffracted rays in accordance with this pitch. When the 0-order component of the reflected rays is cut by the spatial filter 21X, only the higher-order diffracted rays are focused on the slit surface 20X. This image is slit-scanned in the detection direction, and the resulting light intensity is detected and measured by a detector (photomultiplier) 24X, thus producing I(X).

If now the alignment light illuminating the diffraction grating shaped alignment pattern 121X is inhomogeneous in intensity distribution, the resulting I(X) is distorted. Thus, the diffraction grating shaped reference pattern 70, which has pitch p as shown in FIG. 3A which is substantially the same grating pitch as the diffraction grating shaped alignment pattern 121X, is illuminated, and the detected signals of the higher-order diffracted rays are recorded as a reference or reference signal I'(X) in the memory of the computer. Then, each time I(X) shown in FIG. 3B is detected, the processing of $$f(x) = I(X)/aI'(x) \text{ or } f(x) = I(x)-aI'(x)$$

(where a is a proportional constant of the light amount difference correction) is made to correct the inhomogeneous illumination.

Figure 4:
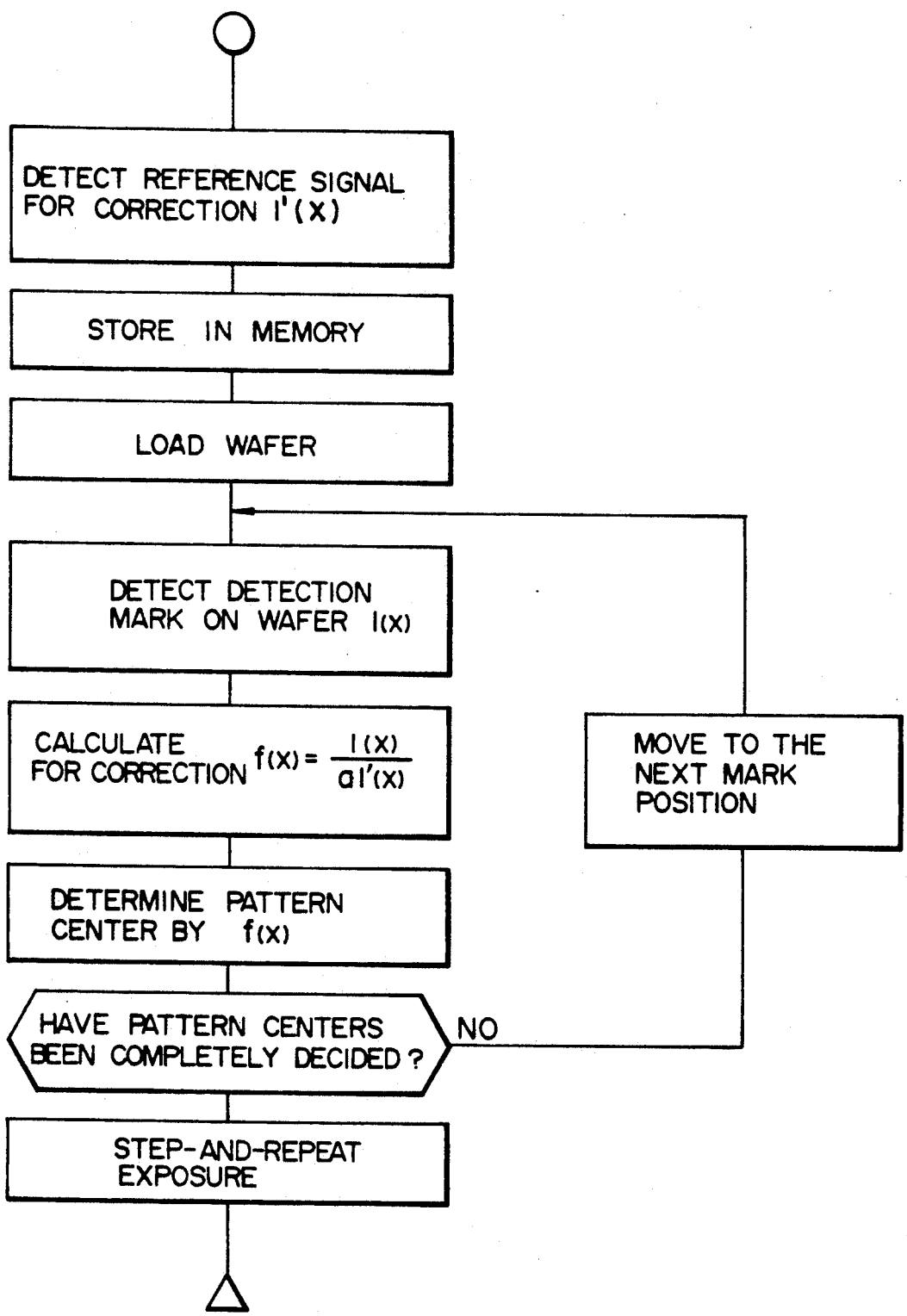
FIG. 4 is a flowchart of the operation of the embodiment of the invention.

The operation of the embodiment will be described with reference to FIG. 4. First, the correction reference signal I'(x) is detected before loading the wafer, and the resulting information is stored in the memory of the computer. Then, the wafer is loaded, and the alignment pattern formed on the wafer is detected. The signal I(x) produced at this time is corrected by using I'(x). The corrected signal f(x) can be calculated by, for example, $$f(x) = I(x)/aI'(x)$$

(where a is a proportional constant)

The center of the pattern is determined in the normal way by using the f(x). After one or several patterns are detected within the wafer, the step-and-repeat exposure is made on the basis of these data.

FIG. 5 shows the block of the computer 200. This computer has terminals leading to the slit drives 23X, 23Y, detectors 24X and 24Y, servo motors 16, 17, and interferometers 183X, 183Y, and terminals leading to the exposure illumination control system and wafer and reticle loader control system. The other terminals provided thereon are not shown.

According to the embodiment of the invention, since the reference signal for the correction of the inhomogeneous illumination is obtained by using the reference diffraction grating of the same pitch as the detection mark used in the normal detection, the angle of the diffracted light is the same. Thus, the rays are passed at the same position through the reduction lens 11, object lens 19X and focusing lens 60X, thus enabling more precise correction to be made for the inhomogeneous illumination. In other words, the background of the diffraction grating shaped alignment pattern detected signal I(X) can be effectively corrected, and thus it is possible to effectively correct the distortion of the diffraction grating shaped alignment pattern detected signal due to the inhomogeneous illumination of the alignment light.

Although the above description is for the correction in the X-direction, the situation for the Y-direction is also the same as mentioned above.

The drawings and the related descriptions given above are useful for the readers to understand the present invention, but do not limit the scope of the invention.

What is claimed is:

1. A light exposure apparatus comprising:
   means for irradiating a pattern formed on a substrate by exposure light and forming an image of said pattern on a surface to be exposed;
   means for irradiating a diffraction grating shaped alignment pattern provided on said surface to be exposed by alignment light to obtain higher-order diffracted light from said alignment pattern and detecting the higher-order diffracted light;
   means for irradiating by said alignment light a diffraction grating shaped reference pattern having substantially the same grating pitch as said diffraction grating shaped alignment pattern to obtain higher-order diffracted light from said reference pattern and detecting the higher-order diffracted light; and
   means for correcting for a background of said detected higher-order diffracted light obtained from said diffraction grating shaped alignment pattern on the basis of said detected higher-order diffracted light obtained from said diffraction grating shaped reference pattern.

2. A light exposure apparatus comprising:
   means for irradiating a pattern formed on a substrate by exposure light and forming an image of said pattern on a surface to be exposed;
   means for irradiating a diffraction grating shaped alignment pattern provided on said surface to exposed by alignment light providing an inhomogeneous illumination to obtain higher-order diffracted light from said alignment pattern and detecting the higher-order diffracted light;
   means for irradiating by said alignment light a diffraction grating shaped reference pattern having substantially the same grating pitch as said diffraction grating shaped alignment pattern to obtain higher-order diffracted light from said reference pattern and detecting the higher-order diffracted light; and
   means for correcting for a distortion of the detected higher-order diffracted light obtained from said diffraction grating shaped alignment pattern due to the inhomogeneous illumination provided by said alignment light on the basis of said detected higher-order diffracted light obtained from said diffraction grating shaped reference pattern.

3. A light exposure apparatus according to claim 1, wherein said correcting means includes means for producing a ratio of a signal representative of said detected higher-order diffracted light obtained from said diffraction grating shaped alignment pattern and a signal representative of said detected higher-order diffracted light obtained from said diffraction grating shaped reference pattern.

4. A light exposure apparatus according to claim 2, wherein said correcting means includes means for producing a ratio of a signal representative of said detected higher-order diffracted light obtained from said diffraction grating shaped alignment pattern and a signal representative of said detected higher-order diffracted light obtained from said diffraction grating shaped reference pattern.

5. A light exposure apparatus according to claim 1, wherein said correcting means includes means for producing a difference between a signal representative of said detected higher-order diffracted light obtained from said diffraction grating shaped alignment pattern and a signal representative of said detected higher-order diffracted light obtained from said diffraction grating shaped reference pattern.

6. A light exposure apparatus according to claim 2, wherein said correcting means includes means for producing a difference between a signal representative of said detected higher-order diffracted light obtained from said diffraction grating shaped alignment pattern and a signal representative of said detected higher-order diffracted light obtained from said diffraction grating shaped reference pattern.

7. A pattern detecting method for irradiating by light a diffraction grating shaped alignment pattern so as to obtain higher-order diffracted light therefrom, and detecting the higher-order diffracted light, comprising the steps of:
  irradiating a diffraction grating shaped reference pattern having substantially the same grating pitch as said diffraction grating shaped alignment pattern by said light so as to obtain higher-order diffracted light;
  detecting higher-order diffracted light obtained from said diffraction grating shaped reference pattern; and
  correcting the background of said signal obtained from said diffraction grating shaped alignment pattern on the basis of said signal obtained from said diffraction grating shaped reference pattern.

8. A pattern detecting method for irradiating by light a diffraction grating shaped alignment pattern so as to obtain higher-order diffracted light therefrom, and detecting the higher-order diffracted light comprising the steps of:
  irradiating a diffraction grating shaped reference pattern having substantially the same grating pitch as said diffraction grating shaped alignment pattern by said light so as to obtain higher-order diffracted light;
  detecting the higher-order diffracted light obtained from said diffraction grating shaped reference pattern; and
  correcting the distortion of said signal obtained from said diffraction grating shaped alignment pattern due to the inhomogeneous illumination by said light on the basis of said signal obtained from said diffraction grating shaped reference pattern.

9. A pattern detecting method according to claim 7, wherein said correction is made by one of obtaining the ratio of said signal obtained from said diffraction grating shaped alignment pattern to said signal obtained from said diffraction grating shaped reference pattern and obtaining the difference therebetween.

10. A pattern detecting method according to claim 8, wherein said correction is made by one of obtaining the ratio of said signal obtained from said diffraction grating shaped alignment pattern to said signal obtained from said diffraction grating shaped reference pattern and obtaining the difference therebetween.

11. A pattern detecting apparatus comprising:
  means for irradiating by light a diffraction grating shaped alignment pattern so as to obtain higher-order diffracted light, detecting the higher-order diffracted light;
  means for irradiating a diffraction grating shaped reference pattern having substantially the same grating pitch as said diffraction grating shaped alignment pattern by said light so as to obtain higher-order diffracted light, detecting the higher-order diffracted light obtained from said diffraction grating shaped reference pattern, and correcting at least one of the background and distortion of the signal obtained from said diffraction grating shaped alignment pattern on the basis of said signal obtained from said diffraction grating shaped reference pattern.

12. A pattern detecting apparatus according to claim 11, wherein said correcting means includes at least one of means for obtaining the ratio of the signal obtained from said diffraction grating shaped alignment pattern to the signal obtained from said diffraction grating shaped reference pattern and means for obtaining the difference therebetween.

13. A pattern detecting method for irradiating by light a diffraction grating shaped alignment pattern so as to obtain higher-order diffracted light therefrom, and detecting the higher-order diffracted light, comprising the steps of:
  irradiating a diffraction grating shaped reference pattern having substantially the same grating pitch as said diffraction grating shaped alignment pattern by said light so as to obtain higher-order diffracted light,
  detecting the higher-order diffracted light obtained from said diffraction grating shaped reference pattern; and
  comparing the signal obtained from said diffraction grating shaped reference pattern with the signal obtained from said diffraction grating shaped alignment pattern.

14. A pattern detecting apparatus comprising:
  means for irradiating by light a diffraction grating shaped alignment pattern so as to obtain higher-order diffracted light therefrom, and detecting the higher-order diffracted light;
  means for irradiating a diffraction grating shaped reference pattern having substantially the same grating pitch as said diffraction grating shaped alignment pattern by said light so as to obtain higher-order diffracted light detecting the higher-order diffracted light obtained from said diffraction grating shaped reference pattern, and comparing the signal obtained from said diffraction grating shaped reference pattern with the signal obtained from said diffraction grating shaped alignment pattern.

* * * * *